United States Patent
Shinya et al.

(10) Patent No.: US 8,431,654 B2
(45) Date of Patent: Apr. 30, 2013

(54) EPOXY RESIN COMPOSITION

(75) Inventors: Yoshihisa Shinya, Tochigi (JP); Jun Yamamoto, Tochigi (JP); Ryota Aizaki, Tochigi (JP); Naoki Hayashi, Tochigi (JP); Misao Konishi, Tochigi (JP)

(73) Assignee: Sony Chemical & Information Device Corporation, Tokyo (JP)

( * ) Notice: Subject to any disclaimer, the term of this patent is extended or adjusted under 35 U.S.C. 154(b) by 446 days.

(21) Appl. No.: 12/451,798

(22) PCT Filed: Mar. 18, 2008

(86) PCT No.: PCT/JP2008/054924
§ 371 (c)(1),
(2), (4) Date: Dec. 1, 2009

(87) PCT Pub. No.: WO2008/152843
PCT Pub. Date: Dec. 18, 2008

(65) Prior Publication Data
US 2010/0193228 A1 Aug. 5, 2010

(30) Foreign Application Priority Data

Jun. 15, 2007 (JP) .................. 2007-158283

(51) Int. Cl.
C08G 59/70 (2006.01)
C08L 63/00 (2006.01)
C08L 63/02 (2006.01)
C08L 63/04 (2006.01)
C07F 5/02 (2006.01)

(52) U.S. Cl.
USPC .............. 525/523; 525/480; 528/90

(58) Field of Classification Search ........... None
See application file for complete search history.

(56) References Cited

U.S. PATENT DOCUMENTS

| | | | |
|---|---|---|---|
| 7,829,743 B2 * | 11/2010 | Shinya | 568/6 |
| 2004/0202942 A1 | 10/2004 | Takeyama | |
| 2010/0022801 A1 * | 1/2010 | Shinya | 568/6 |

FOREIGN PATENT DOCUMENTS

| | | | |
|---|---|---|---|
| EP | 0 393 893 A1 | | 10/1990 |
| EP | 2 078 722 A1 | | 7/2009 |
| FR | 2727416 A1 | * | 5/1996 |
| JP | A-3-47164 | | 2/1991 |
| JP | 3-237107 A | * | 10/1991 |
| JP | A-4-1177 | | 1/1992 |
| JP | A-5-230189 | | 9/1993 |
| JP | A-8-188570 | | 7/1996 |
| JP | 9-176112 A | * | 7/1997 |
| JP | A-9-176112 | | 7/1997 |
| JP | 10-120766 A | * | 5/1998 |
| JP | A-10-120766 | | 5/1998 |
| JP | A-10-245378 | | 9/1998 |
| JP | A-10-310587 | | 11/1998 |
| JP | A-11-255739 | | 9/1999 |
| JP | A-2000-191751 | | 7/2000 |
| JP | A-2002-097443 | | 4/2002 |
| JP | A-2005-43862 | | 2/2005 |
| JP | A-2006-199778 | | 8/2006 |
| JP | A-2006-282633 | | 10/2006 |
| JP | A-2006-335985 | | 12/2006 |

OTHER PUBLICATIONS

Office Action issued in Korean Patent Application No. 2009-7025723 dated Oct. 21, 2011 (with translation).
Submission of Publication and the Like issued in Japanese Application No. 2007-158283 dated Apr. 7, 2011 (with translation).
International Search Report for International Application No. PCT/JP2008/054924, issued May 27, 2008.
European Search Report issued in European Patent Application No. 08722318.6 dated Aug. 19, 2010.
Toba et al., "Cationic Photopolymerization of Epoxides by Direct and Sensitized Photolysis of Onium Tetrakis(pentafluorophenyl)borate Initiators," *Macromolecules*, 1999, pp. 3209-3215, vol. 32, No. 10, American Chemical Society.
International Preliminary Report on Patentability issued in International Application No. PCT/JP2008/054924 on Feb. 11, 2010.
Chinese Office Action issued in Chinese Application No. 200880103280.1 dated Nov. 1, 2011 (with translation).
Jan. 17, 2012 Taiwanese Office Action issued in Taiwanese Patent Application No. 97110902 (with translation).
Kakiuchi; "New Developments in Epoxy Resin Curing Agents (Epoxy Jushi Kokazai no Shin-tenkai);" First Edition, May 31, 1994; pp. 167-174; CMC Publishing Co., Ltd.
Japanese Office Action issued in Japanese Patent Application No. 2007-158283 dated Oct. 24, 2012 (with translation).

* cited by examiner

*Primary Examiner* — Robert Sellers
(74) *Attorney, Agent, or Firm* — Oliff & Berridge, PLC

(57) ABSTRACT

An epoxy resin composition containing an epoxy resin and a thermal cationic polymerization initiator not only can reduce the amount of fluorine ions generated during thermal cationic polymerization to improve electrolytic corrosion resistance but also is excellent in low-temperature rapid curability. The epoxy resin composition uses a sulfonium borate complex represented by the formula (1) as the thermal cationic polymerization initiator.

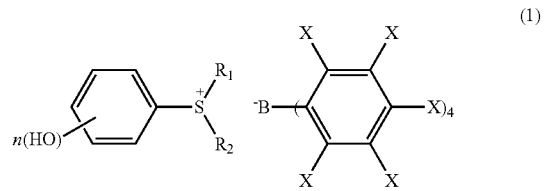

(1)

In the formula (1), $R_1$ is an aralkyl group, and $R_2$ is a lower alkyl group, provided that when $R_2$ is a methyl group, $R_1$ is not a benzyl group. X is a halogen atom, and n is an integer of 1 to 3.

9 Claims, 2 Drawing Sheets

FIG. 2

EPOXY RESIN COMPOSITION

TECHNICAL FIELD

The present invention relates to an epoxy resin composition containing a novel thermal cationic polymerization initiator and to a connection structure in which a wiring substrate and an electronic component are connected through the epoxy resin composition.

BACKGROUND ART

Conventionally, a cationic photopolymerizable epoxy resin composition is used as one type of an adhesive used for mounting an electronic component such as an IC chip on a wiring substrate. Such a cationic photopolymerizable epoxy resin composition contains a cationic photopolymerization initiator that generates protons through light to initiate cationic polymerization. One known example of the cationic photopolymerization initiator is a sulfonium antimonate complex.

However, such a sulfonium antimonate complex contains, as a counter anion, $SbF_6^-$ in which fluorine atoms are bonded to antimony, which is a metal. Therefore, a large amount of fluorine ions are generated during cationic polymerization. This induces migration between different metals, causing a problem of corrosion of metal wiring and connection pads. Patent Document 1 proposes to use, as a cationic polymerization initiator, a sulfonium borate complex that uses, instead of $SbF_6^-$, a tetrakis(pentafluorophenyl)borate anion $[(C_6F_5)_4B^-]$ in which fluorine atoms are bonded to carbon atoms. A complex of the following formula (1c) [p-hydroxyphenyl-benzyl-methylsulfonium tetrakis(pentafluorophenyl)borate] is actually commercially available.

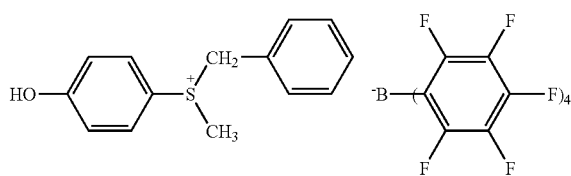

(1c)

When an electronic component is mounted on a wiring substrate, the bonding area often cannot be irradiated with light. Therefore, an attempt is being made to use the specific sulfonium borate complex disclosed in Examples of Patent Document 1 as a thermal cationic polymerization initiator for a thermal cationic polymerizable epoxy resin composition. In this case, there is a demand not only to reduce the amount of fluorine ions generated during cationic polymerization to improve the electrolytic corrosion resistance of the epoxy resin composition but also to improve the low-temperature rapid curability of the epoxy resin composition to improve productivity.

[Patent Document 1] Japanese Patent Application Laid-Open No. Hei. 09-176112.

DISCLOSURE OF THE INVENTION

Problems to be Solved by the Invention

When the complex of the formula (1c) is used as the thermal cationic polymerization initiator for an epoxy resin composition, the amount of fluorine ions generated during thermal cationic polymerization can be reduced to some extent, so that the electrolytic corrosion resistance can be improved. However, the low-temperature rapid curability of the epoxy resin composition is not sufficiently improved.

The present invention solves the above problems in the conventional technology, and it is an object of the invention to provide an epoxy resin composition that not only can reduce the amount of fluorine ions generated during thermal cationic polymerization to improve the electrolytic corrosion resistance but also is excellent in low-temperature rapid curability.

Means for Solving the Problems

The present inventors have found that the above object can be achieved by using, as a thermal cationic polymerization initiator for an epoxy resin composition, a novel sulfonium borate complex including a novel combination of specific three substituents. Thus, the invention has been completed.

Accordingly, the present invention provides an epoxy resin composition comprising an epoxy resin and a thermal cationic polymerization initiator, wherein the thermal cationic polymerization initiator is a sulfonium borate complex represented by the formula (1):

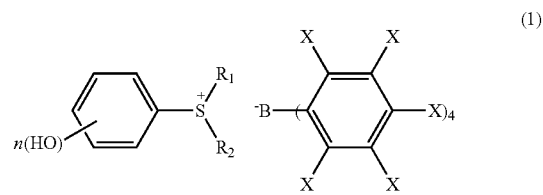

(1)

wherein, in the formula (1), $R_1$ is an aralkyl group, $R_2$ is a lower alkyl group, X is a halogen atom, and n is an integer of 1 to 3, provided that, when $R_2$ is a methyl group, $R_1$ is not a benzyl group.

The present invention also provides a connection structure comprising a wiring substrate and an electronic component bonded onto the wiring substrate through a thermally cured product of the above epoxy resin composition.

Effects Of The Invention

The epoxy resin composition of the present invention uses the novel sulfonium borate complex of the formula (1) as a thermal cationic polymerization initiator for the epoxy resin. Therefore, the amount of fluorine ions generated during thermal cationic polymerization is reduced, so that the electrolytic corrosion resistance is improved. In addition, favorable low-temperature rapid curability can be achieved.

BRIEF DESCRIPTION OF THE DRAWINGS

FIG. 2 is a $^1$H-NMR chart of a sulfonium borate complex of Reference Example 2.

BEST MODE FOR CARRYING OUT THE INVENTION

Figure 1:
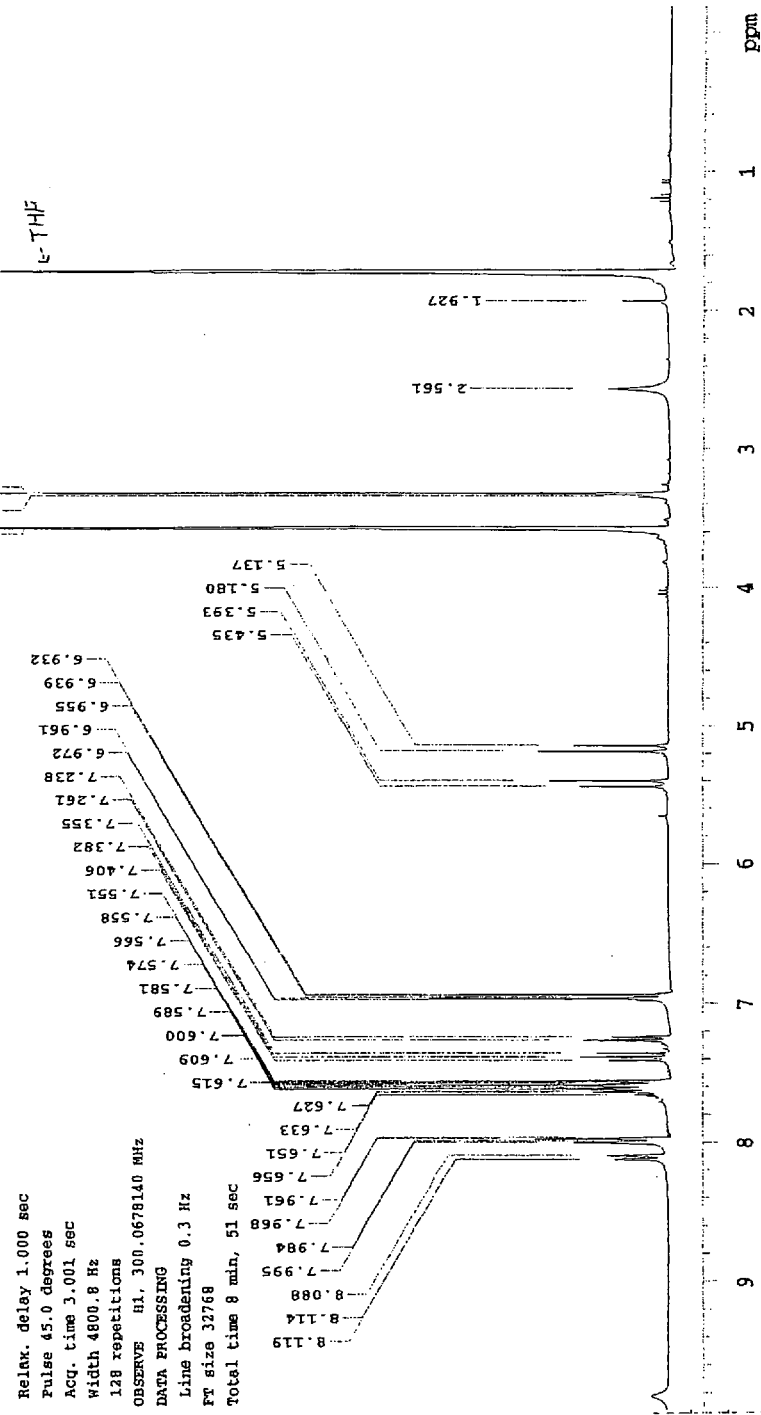
FIG. 1 is a $^1$H-NMR chart of a sulfonium borate complex of Reference Example 1.

The epoxy resin composition of the present invention contains an epoxy resin and a novel sulfonium borate complex represented by the formula (1) as a thermal cationic polymerization initiator.

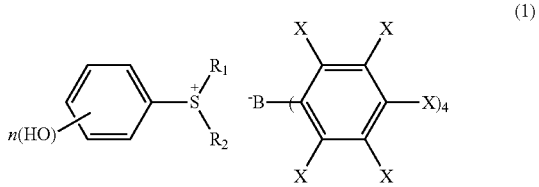

(1)

Examples of the aralkyl group of $R_1$ in the formula (1) include a benzyl group, an o-methylbenzyl group, a (1-naphthyl)methyl group, a pyridylmethyl group, an anthracenylmethyl group and the like. Of these, a (1-naphthyl)methyl group is preferred because of its favorable rapid curability and availability.

Examples of the lower alkyl group of $R_2$ include a methyl group, an ethyl group, a propyl group, a butyl group and the like. Of these, a methyl group is preferred because of its favorable rapid curability and availability. It should be noted that when the lower alkyl group of $R_2$ is a methyl group, the aralkyl group of $R_1$ is not a benzyl group.

n represents the number of hydroxyl groups on the phenyl group bonded to the sulfonium residue and is an integer of 1 to 3. The case n=1 gives a 4-hydroxyphenyl group, a 2-hydroxyphenyl group, or a 3-hydroxyphenyl group. The case n=2 gives a 2,4-dihydroxyphenyl group, a 2,6-dihydroxyphenyl group, a 3,5-dihydroxyphenyl group, a 2,3-dihydroxyphenyl group, or the like. The case n=3 gives a 2,4,6-trihydroxyphenyl group, a 2,4,5-trihydroxyphenyl group, a 2,3,4-trihydroxyphenyl group, or the like. Of these, a 4-hydroxyphenyl group in which n is 1 and a hydroxyl group is bonded to the para position is preferred because of its favorable rapid curability and availability.

The halogen atom of X is a fluorine atom, a chlorine atom, a bromine atom, or an iodine atom. Of these, a fluorine atom having high electron withdrawing properties is preferred to improve reactivity.

The novel sulfonium borate complex of the formula (1) that is used as a thermal cationic polymerization initiator in the epoxy resin composition of the present invention can be produced according to the following reaction formula. In the formulas (1), (2), and (3), $R_1$ is an aralkyl group, $R_2$ is a lower alkyl group, X is a halogen atom, and n is an integer of 1 to 3.

<Reaction formula>

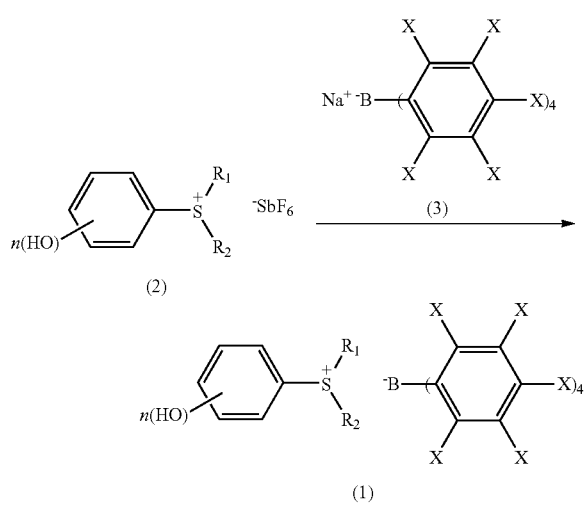

More specifically, the sulfonium antimonate complex of the formula (2) (see Japanese Patent Application Laid-Open No. Hei. 10-245378 for its synthesis method) is dissolved in an organic solvent such as ethyl acetate. The prepared solution is mixed with an equal molar amount of an aqueous solution of the sodium borate of the formula (3) (see Japanese Patent Application Laid-Open No. Hei. 10-310587 for its synthesis method). The obtained two-phase mixture is stirred at a temperature of 20 to 80° C. for 1 to 3 hours to allow the sodium borate of the formula (3) to react with the sulfonium antimonate complex of the formula (2), whereby the sulfonium borate complex of the formula (1) is obtained. The sulfonium borate complex of the formula (1) can be isolated by separating and drying the organic solvent layer and then removing the organic solvent by evaporation under reduced pressure. The target sulfonium borate complex is obtained as the evaporation residue.

Any thermosetting epoxy resin conventionally used for bonding of electronic materials may be appropriately used as the epoxy resin constituting the epoxy resin composition of the present invention. Such a thermosetting epoxy resin may be a liquid or a solid. The epoxy equivalent of the thermosetting epoxy resin is normally about 100 to about 4000, and preferably the thermosetting epoxy resin has 2 or more epoxy groups in its molecule. Examples of the thermosetting epoxy resin that can be preferably used include bisphenol A type epoxy compounds, phenol novolac type epoxy compounds, cresol novolac type epoxy compounds, ester type epoxy compounds, and alicyclic type epoxy compounds. These compounds may be in the form of a monomer or oligomer.

In the epoxy resin composition of the present invention, when the amount of the sulfonium borate complex of the formula (1) with respect to 100 parts by mass of the epoxy resin is too small, the epoxy resin composition is not sufficiently cured. When the amount is too large, the storage stability may deteriorate. Therefore, the amount of the sulfonium borate complex is preferably 0.1 to 10 parts by mass and more preferably 0.5 to 5 parts by mass.

The epoxy resin composition of the present invention may contain, in addition to the above thermosetting epoxy resin, a thermosetting resin, such as a thermosetting urea resin, a thermosetting melamine resin, or a thermosetting phenol resin, and a thermoplastic resin, such as a polyester resin or a polyurethane resin in amounts not adversely affecting the effects of the invention.

The epoxy resin composition of the present invention may further contain, if necessary, a filler such as silica or mica, a pigment, an antistatic agent, a silane coupling agent, and other additives. The epoxy resin composition of the present invention may be used in the form of a solution in a solvent such as toluene, a paste, or a deposited film.

The epoxy resin composition of the present invention can be manufactured by uniformly mixing the epoxy resin, the thermal cationic polymerization initiator, and other additives such as a silane coupling agent, a thermosetting resin, and a filler, which are added if necessary, and stirring the mixture according to the common procedure.

The thus-obtained epoxy resin composition of the present invention uses the novel sulfonium borate complex as a thermal cationic polymerization initiator. Therefore, the amount of fluorine ions generated during thermal cationic polymerization is reduced, so that the electrolytic corrosion resistance is improved. In addition, low-temperature rapid curability is achieved.

Accordingly, the epoxy resin composition of the present invention can be preferably used when an electronic component is mounted on a wiring substrate. In such a case, a connection structure excellent in electrolytic corrosion resistance is obtained in which the electronic component is bonded onto the wiring substrate through the thermally cured product of the epoxy resin composition. This connection structure is also a part of the present invention.

Examples of the wiring substrate include flexible printed substrates, glass epoxy substrates, glass substrates, tape substrates and the like. Examples of the electronic component include IC chips, resistance elements, capacitor elements, antenna elements, switching elements and the like.

The epoxy resin composition (in a paste form, a film shape, or the like) of the present invention can be thermally, cationically polymerized by heating at 100 to 250° C.

EXAMPLES

Reference Examples 1, 2, and 3

Each of sulfonium antimonate complexes of the formulas (1d), (1e), and (1f) (see Japanese Patent Application Laid-Open No. Hei. 10-245378 for their synthesis methods) was dissolved in ethyl acetate to prepare 10 mass % ethyl acetate solution of each of the complexes. Separately, a 10 mass % aqueous solution of the sodium borate of the formula (3) (see Japanese Patent Application Laid-Open No. Hei. 10-310587 for its synthesis method) was prepared.

Next, each of the 10 mass % ethyl acetate solutions of these complexes was mixed with an equal molar amount of the 10 mass % aqueous solution of the sodium borate of the formula (3) at room temperature, and each mixture was stirred for 30 minutes. Then the ethyl acetate layer was separated from the reaction mixture and dried, and ethyl acetate was removed under reduced pressure. A sulfonium borate complex of the formula (1a) of Reference Example 1, a sulfonium borate complex of the formula (1b) of Reference Example 2, or a sulfonium borate complex of the formula (1c) of Reference Example 3 was obtained as an evaporation residue.

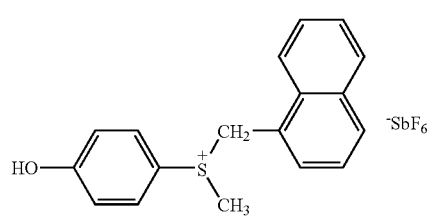
(1d)

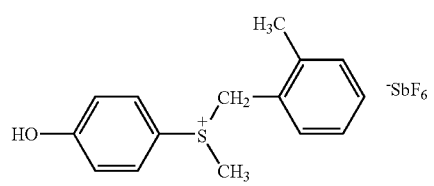
(1e)

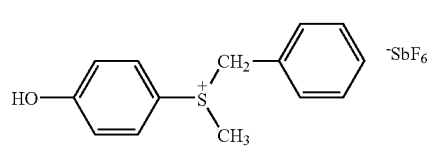
(1f)

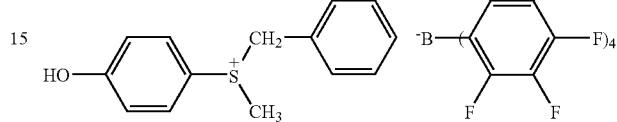
(3)

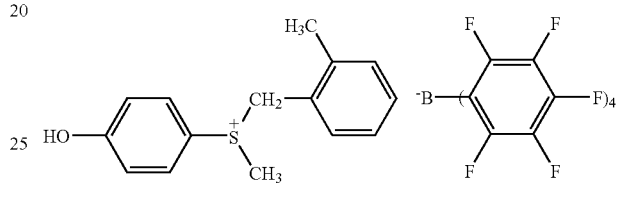
(1a)

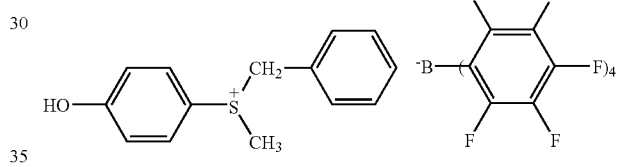
(1b)

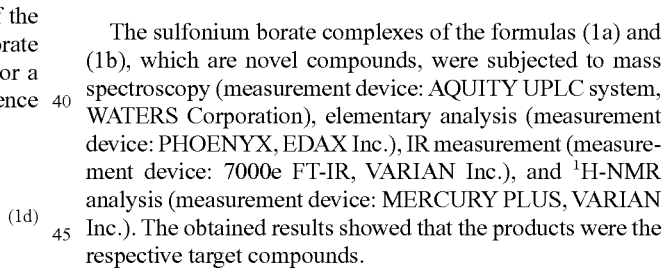
(1c)

The sulfonium borate complexes of the formulas (1a) and (1b), which are novel compounds, were subjected to mass spectroscopy (measurement device: AQUITY UPLC system, WATERS Corporation), elementary analysis (measurement device: PHOENYX, EDAX Inc.), IR measurement (measurement device: 7000e FT-IR, VARIAN Inc.), and $^1$H-NMR analysis (measurement device: MERCURY PLUS, VARIAN Inc.). The obtained results showed that the products were the respective target compounds.

Analysis results of the sulfonium borate complex of the formula (1a) [4-hydroxyphenyl-methyl-1-naphthylmethyl-sulfonium tetrakis(pentafluorophenyl)borate]

<MS Spectrometry Results>

$M^+$=281 (sulfonium residue)

$M^+$=679 (borate residue)

<Elementary Analysis Results>

Measured values C, 52.51; H, 1.89

Theoretical values C, 52.52; H, 1.78

<IR Analysis Results (cm$^{-1}$)>

662 (C—S), 776, 980, 1088, 1276 (Ar—F), 1300, 1374, 1464, 1514, 1583, 1643, 2881 (C—H), 2981 (C—H), 3107 (O—H)

<$^1$H-NMR Analysis Results (δ Value), see FIG. 1 (THF was Used)>

2.6 (1H, (d)), 3.3 (3H, (a)), 5.3 (2H, (e)), 6.9 (2H, (c)), 7.6 (2H, (b)), 7.2-8.1 (7H, (f), (g), (h), (i), (j), (k), (l))

(Proton Assignment)

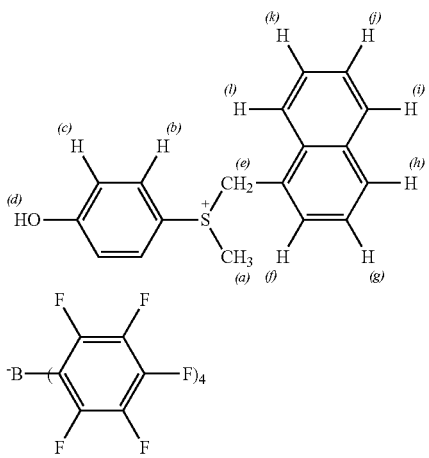

Figure 2:
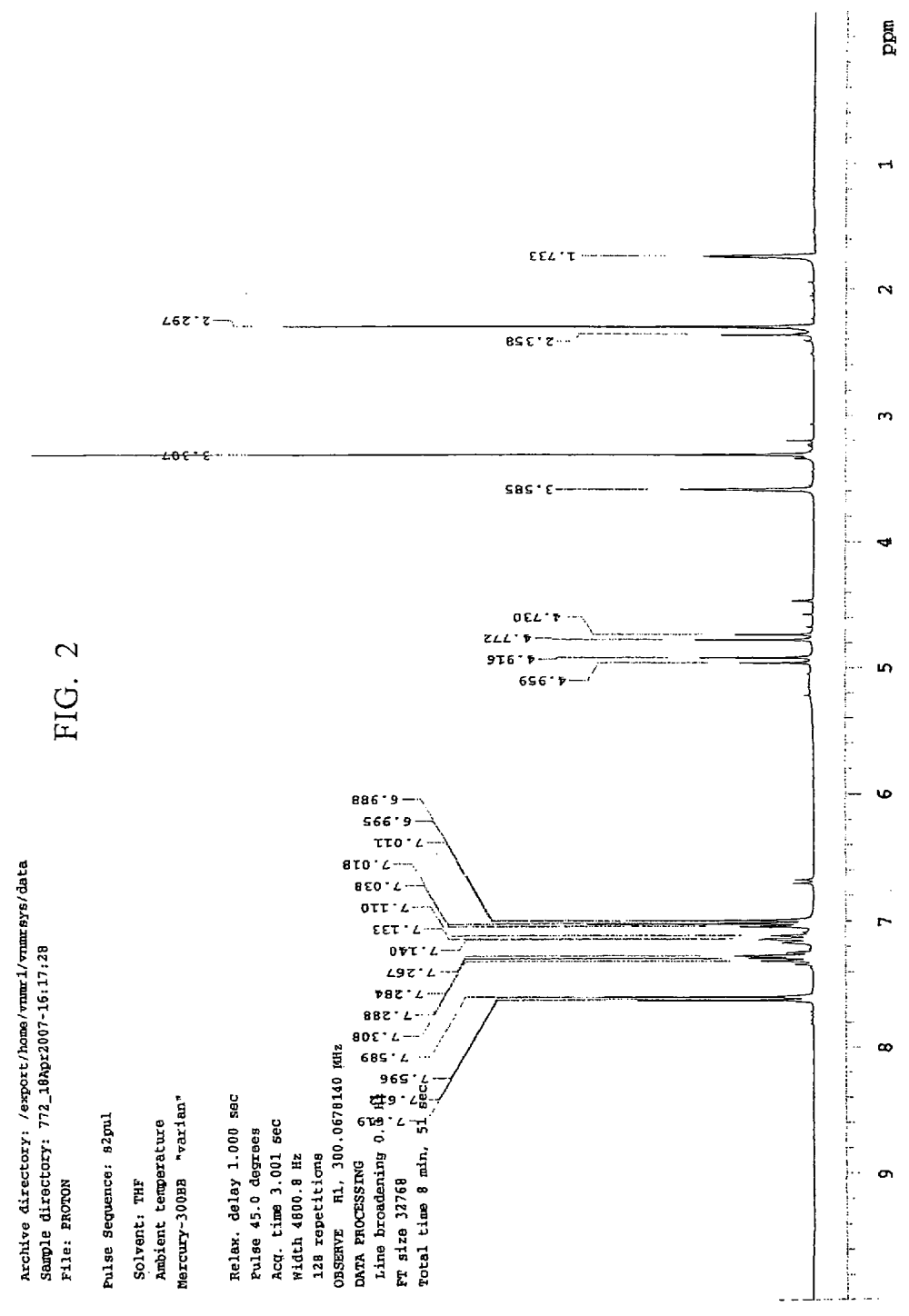

Analysis results of the sulfonium borate complex of the formula (1b) [4-hydroxyphenyl-methyl-(2-methyl benzyl) sulfonium tetrakis(pentafluorophenyl)borate]
<MS Spectrometry Results>
M⁺=245 (sulfonium residue)
M⁺=679 (borate residue)
<Elementary Analysis Results>
Measured values C, 50.39; H, 1.77
Theoretical values C, 50.60; H, 1.80
<IR Analysis Results (cm⁻¹)>
662 (C—S), 773, 980, 1088, 1276 (Ar—F), 1463, 1514, 1583, 1644, 2882 (C—H), 2983 (C—H), 3109 (O—H)
<¹H-NMR Analysis Results (δ value), see FIG. 2 (THF was Used)>
2.3 (3H, (j)), 2.4 (1H, (d)), 3.3 (3H, (a)), 4.8 (2H, (e)), 7.0 (2H, (c)), 7.6 (2H, (b)), 7.0-7.4 (4H, (f), (g), (h), (i))
(Proton Assignment)

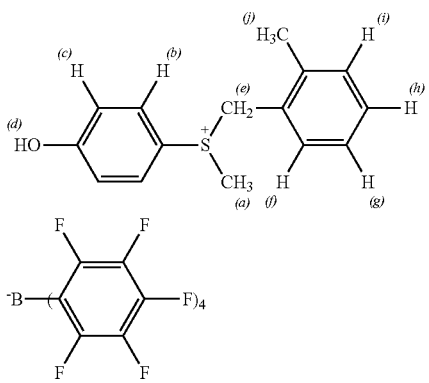

(Evaluation of Fluorine Ion Generation from the Complexes)
The amount of fluorine ions generated from each of the sulfonium borate complexes of Reference Examples 1 to 3 and the sulfonium antimonate complexes of the formulas (1d), (1e), and (1f) was measured under the temperature condition during thermal cationic polymerization. More specifically, 0.2 g of each complex was added to 10 mL of pure water, and each solution was heated at 100° C. for 10 hours. Then the amount of fluorine ions in the supernatant was measured by ion chromatography analysis (Dyonics Inc.).

The results obtained are shown in Table 1. Practically, the amount of fluorine ions is desirably 10 ppm or less.

TABLE 1

| Complex | Amount of fluorine ions generated (ppm) |
|---|---|
| Sulfonium borate complex (1a) | 2.1 |
| Sulfonium borate complex (1b) | 2.3 |
| Sulfonium borate complex (1c) | 2.3 |
| Sulfonium antimonate complex (1d) | 160000 |
| Sulfonium antimonate complex (1e) | 170000 |
| Sulfonium antimonate complex (1f) | 172000 |

As can be seen form Table 1, the amount of fluorine ions generated from each sulfonium borate complex was very small. Therefore, the sulfonium borate complexes are useful as a thermal cationic polymerization initiator.

Examples 1 to 4 and Comparative Examples 1 to 8

The components shown in Table 2 were uniformly mixed to prepare each epoxy resin composition. Each epoxy resin composition was subjected to differential thermal analysis measurement (DSC measurement) as described below, and also an electrolytic corrosion resistance test was performed.
<DSC Measurement>
Each epoxy resin composition was subjected to differential thermal analysis (exothermic onset temperature, peak temperature, heat value) at a temperature rising rate of 10° C./min using a thermal analysis apparatus (DSC 5100, Seiko Instruments Inc). The results obtained are shown in Table 2.

The exothermic onset temperature is a temperature at which protons are generated from the complex and cationic polymerization is started. The lower the exothermic onset temperature, the better the low-temperature curability. However, the storage stability tends to decrease. Therefore, practically, the exothermic onset temperature is preferably 60 to 110° C. When the exothermic peak temperature is too low, the storage stability is low. When the exothermic peak temperature is too high, a curing failure tends to occur. Therefore, practically, the exothermic peak temperature is 100 to 140° C. The heat value is reaction heat. When the heat value is too low, a curing failure tends to occur. Therefore, generally, the heat value is desirably 100 J/g or more, which depends on the epoxy resin used.
<Electrolytic Corrosion Resistance Test (Migration Test)>
A glass wiring substrate was prepared by forming, on a glass substrate, Al/Cr/ITO electrodes or Mo/ITO electrodes into a comb shape with 20 μm gaps. Each epoxy resin composition to be tested was applied to a thickness of 20 μm to the glass wiring substrate and was heated and cured at 200° C. for 10 minutes, whereby test pieces were obtained. Each obtained test piece was placed in a thermostatic bath at 85° C. and 85% RH and left to stand for 12 hours while a voltage of 30 V was applied between the electrodes. Subsequently, the front and rear surfaces of the glass wiring substrate were observed under an optical microscope to determine whether or not discoloration, defects, break, and the like occurred in the electrodes. The results were evaluated using the following criteria. The results obtained are shown in Table 2.
Criteria for Electrolytic Corrosion Resistance Evaluation
G: Discoloration, defects, break, and the like were not found.
NG: Discoloration, defects, break, and the like were found.

TABLE 2

| Component name | | Example (parts by mass) | | | | Comparative Example (parts by mass) | | | | | | | |
|---|---|---|---|---|---|---|---|---|---|---|---|---|---|
| | | 1 | 2 | 3 | 4 | 1 | 2 | 3 | 4 | 5 | 6 | 7 | 8 |
| Bisphenol A liquid epoxy resin *1 | | 100 | 100 | 100 | 100 | 100 | 100 | 100 | 100 | 100 | 100 | 100 | 100 |
| Thermal cationic polymerization initiator | Complex (1a) *2 | 5 | 5 | | | | | | | | | | |
| | Complex (1b) *3 | | | 5 | 5 | | | | | | | | |
| | Complex (1c) *4 | | | | | 5 | 5 | | | | | | |
| | Complex (1d) *5 | | | | | | | 5 | 5 | | | | |
| | Complex (1e) *6 | | | | | | | | | 5 | 5 | | |
| | Complex (1f) *7 | | | | | | | | | | | 5 | 5 |
| Silane coupling agent *8 | | | 1 | | 1 | | 1 | | 1 | | 1 | | 1 |
| Filler (spherical fused silica) *9 | | | 100 | | 100 | | 100 | | 100 | | 100 | | 100 |
| <Evaluation results> | | | | | | | | | | | | | |
| DSC measurement | Exothermic onset temperature (° C.) | 83 | 84 | 103 | 103 | 115 | 117 | 83 | 84 | 106 | 107 | 116 | 117 |
| | Exothermic peak temperature (° C.) | 112 | 112 | 132 | 131 | 147 | 146 | 118 | 119 | 135 | 134 | 146 | 147 |
| | *Heat value (J/g) | 250 | 245 | 320 | 310 | 270 | 280 | 290 | 280 | 300 | 310 | 280 | 290 |
| Electrolytic corrosion resistance evaluation Al/Cr/ITO | | G | G | G | G | G | G | NG | NG | NG | NG | NG | NG |
| Electrolytic corrosion resistance evaluation Mo/ITO | | G | G | G | G | G | G | NG | NG | NG | NG | NG | NG |

*1: EPIKOTE 828, Japan Epoxy Resins Co., Ltd.
*2 to *7: Described above
*8: γ-glycidoxypropyltrimethoxysilane
*9: Spherical fused silica (EB-6D, DENKI KAGAKU KOGYO KABUSHIKI KAISHA)
*Heat value: Amount of heat per gram of epoxy resin The epoxy resin compositions of Examples 1 to 4 used the respective novel sulfonium borate complexes of formula (1) or (2). Therefore, the reaction starting temperature in the DSC measurement fell within the range of 60 to 110° C., and the exothermic peak temperature fell within the range of 100 to 140° C. The heat value was 100 J/g or more, and the evaluation results for the electrolytic corrosion resistance were G. Therefore, the results were practically satisfactory.

In Comparative Examples 1 and 2 which used complexes different from those used in the Examples, the evaluation results for the exothermic onset temperature and the exothermic peak temperature were problematic. In Comparative Examples 3 to 6, the evaluation results for the electrolytic corrosion resistance were problematic. In Comparative Examples 7 and 8, the evaluation results for the exothermic onset temperature, the exothermic peak temperature, and the electrolytic corrosion resistance were problematic.

Industrial Applicability

The epoxy resin composition of the present invention uses the novel sulfonium borate complex of formula (1) as a thermal cationic polymerization initiator for the epoxy resin. Therefore, the amount of fluorine ions generated during thermal cationic polymerization is reduced, so that the electrolytic corrosion resistance is improved. In addition, low-temperature rapid curability can be achieved. The epoxy resin composition of the present invention can be preferably used when an electronic component is mounted on a wiring substrate.

The invention claimed is:

1. An epoxy resin composition comprising an epoxy resin and a thermal cationic polymerization initiator, wherein the thermal cationic polymerization initiator is a sulfonium borate complex represented by the formula (1):

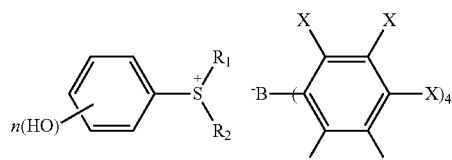

(1)

wherein in the formula (1), $R_1$ is an o-methylbenzyl group or a (1-naphthy)pmethyl group, $R_2$ is a methyl group, an ethyl group, a propyl group, or a butyl group, X is a halogen atom, and n is an integer of 1 to 3.

2. The epoxy resin composition according to claim 1, wherein n is 1, and an OH group is bonded to a para position.

3. The epoxy resin composition according to claim 1, wherein X is a fluorine atom.

4. A connection structure comprising a wiring substrate and an electronic component bonded onto the wiring substrate through a thermally cured product of the epoxy resin composition according to claim 1.

5. An epoxy resin composition comprising an epoxy resin and a thermal cationic initiator, wherein the thermal cationic initiator is represented by the formula (1a)

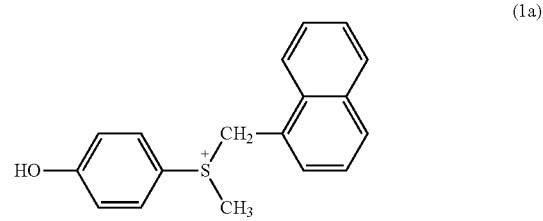

(1a)

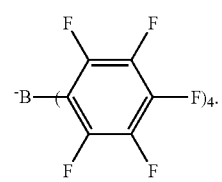

6. An epoxy resin composition comprising an epoxy resin and a thermal cationic initiator, wherein the thermal cationic initiator is represented by the formula (1b)

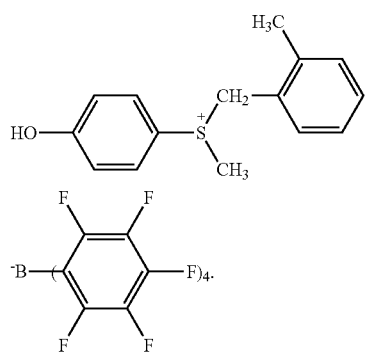

(1b)

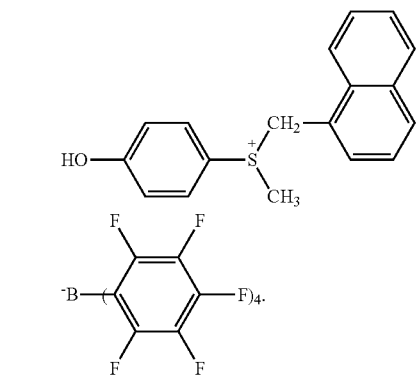

(1a)

7. A method of producing an epoxy resin composition, comprising uniformly mixing an epoxy resin with a thermal cationic initiator, wherein the thermal cationic initiator is a sulfonium borate complex represented by the formula (1):

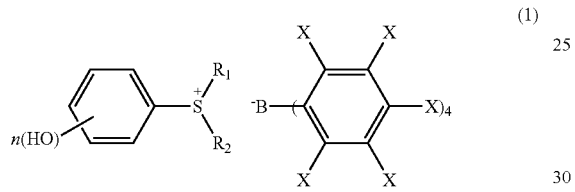

(1)

wherein in the formula (1), $R_1$ is an o-methylbenzyl group or a (1-naphthyl)methyl group and $R_2$ is a methyl group, an ethyl group, a propyl group, or a butyl group.

8. A method of producing an epoxy resin composition, comprising uniformly mixing an epoxy resin with a thermal cationic initiator, wherein the thermal cationic initiator is a sulfonium borate complex represented by the formula (1a)

9. A method of producing an epoxy resin composition, comprising uniformly mixing an epoxy resin with a thermal cationic initiator, wherein the thermal cationic initiator is a sulfonium borate complex represented by the formula (1b)

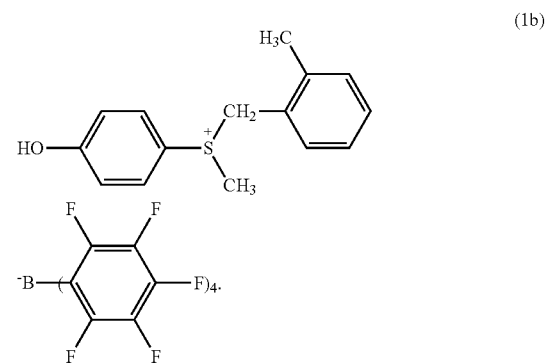

(1b)

* * * * *